United States Patent
Royer et al.

(10) Patent No.: US 6,570,769 B1
(45) Date of Patent: May 27, 2003

(54) ELECTRICAL APPLIANCE WITH TWO IDENTICALLY BUILT CASING SHELLS

(75) Inventors: Fritz Royer, Hahnbach (DE); Gerhard Wilhelm, Kümmersbruck (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/402,922

(22) PCT Filed: Mar. 31, 1998

(86) PCT No.: PCT/DE98/00915

§ 371 (c)(1),
(2), (4) Date: Jan. 31, 2000

(87) PCT Pub. No.: WO98/47336

PCT Pub. Date: Oct. 22, 1998

(30) Foreign Application Priority Data

Apr. 14, 1997 (DE) .......................................... 197 15 521

(51) Int. Cl.⁷ ................................................. H05K 5/00
(52) U.S. Cl. ........................................ 361/752; 439/532
(58) Field of Search ................................ 361/752, 726, 361/728, 740, 756, 778, 753, 800, 818, 816, 825; 439/94, 284, 352, 357, 358, 532, 716

(56) References Cited

U.S. PATENT DOCUMENTS

| | | | | |
|---|---|---|---|---|
| 2,710,949 A | * | 6/1955 | Happe et al. | 339/258 |
| 3,112,148 A | * | 11/1963 | Wochner | 339/116 |
| 3,733,755 A | * | 5/1973 | Butler | 211/187 |
| 3,821,691 A | * | 6/1974 | Reimer | 339/75 R |
| 4,027,096 A | * | 5/1977 | Waddington et al. | 174/52 R |
| 4,049,357 A | * | 9/1977 | Hamish, Jr. | 403/209 |
| 4,260,850 A | * | 4/1981 | Brown et al. | 174/52 R |
| 5,402,322 A | | 3/1995 | Kunkler et al. | |
| 5,449,056 A | * | 9/1995 | Ross | 191/15 |
| 5,503,259 A | * | 4/1996 | Clopton et al. | 191/15 |
| 6,038,130 A | * | 3/2000 | Boeck et al. | 361/735 |
| 6,105,741 A | * | 8/2000 | Ross | 191/23 A |
| 6,431,909 B1 | * | 8/2002 | Nolden et al. | 439/532 |

FOREIGN PATENT DOCUMENTS

| | | |
|---|---|---|
| DE | 30 26 247 | 2/1982 |
| DE | 35 15 772 | 11/1986 |
| DE | 296 06 759 | 8/1996 |
| DE | 297 20 511 | 2/1998 |
| EP | 0 033 286 | 8/1981 |
| EP | 0 154 570 | 9/1985 |
| EP | 0 167 478 | 1/1986 |

\* cited by examiner

Primary Examiner—David Martin
Assistant Examiner—Thanh S. Phan
(74) Attorney, Agent, or Firm—Harness, Dickey & Pierce PLC

(57) ABSTRACT

An electric appliance is described which has a casing composed of two identically built casing shells. A spring locking hook for the snap-on mount on a mounting rail is integrated into each of the casing shells, which are assembled in mirror inversion to one another, yielding a simple, inexpensive and easy-to-assemble design composed of only a few parts.

9 Claims, 5 Drawing Sheets

ELECTRICAL APPLIANCE WITH TWO IDENTICALLY BUILT CASING SHELLS

FIELD OF THE INVENTION

The present invention relates to an electric appliance having a casing composed of two identically designed casing half shells mounted in mirror inversion to one another.

BACKGROUND INFORMATION

An electric appliance composed of two identically designed casing half shells is.

An appliance according to the definition of the species is described in from German Utility Model 296 06 759 U1, which describes a multipart casing in modular design to accommodate a circuit board. This is intended for a multipart casing for low-voltage switchgear, such as time relays, thermistor protective gear, for accommodating a circuit board. The casing here is divided into upper and lower casing parts parallel to the mounting plane. The circuit board is designed with stair-step gradations along two opposite edges and is equipped with cable connectors for connecting screw-type terminals designed in block form in the area of the stair-step gradations. In addition to contact pins, the cable connectors also have mounting pins, optionally designed as hook-shaped locking mounting pins.

German Patent 30 26 247 C2 describes a casing that can be lined up for mounting on a mounting rail. A circuit board having electric connecting elements arranged on its edges can be inserted into the casing. The connecting elements project partially out of the openings in the casing. The casing here is divided perpendicular to the mounting direction in the longitudinal direction of the casing.

SUMMARY

An object of the present invention is to provide an electric appliance of the type described above by creating a casing having a simple, inexpensive design that is easy to assemble and has only a few parts parts, with the mounting accomplished by snap-on attachment without any impairment due to the usual distortion of the casing shells. This object is achieved in that the casing is composed of two identically built casing shells mounted in mirror inversion to one another. The separation joint formed by the two casing shells here does not pass through the integrally molded parts provided for the snap-on mount, so that distortion of the casing shells does not cause any problems in assembly.

An especially advantageous refinement of the present invention is achieved when the two casing shells are joined together by integrally molded catch elements.

An especially simple embodiment minimizing the number of details is achieved by implementing the snap-on mount by two spring locking hooks, one of which is integrated into each of the casing shells.

The embodiment having two identically designed casing shells that can be mounted in mirror inversion to one another can be achieved when the two casing shells in the mounted state form a separation joint which passes through the axes of symmetry of two opposing side walls and outside the spring locking hook.

An especially advantageous embodiment of the terminals, in particular their connection, is achieved when a circuit board having at least two terminal insulators is mounted in the interior of the casing, the terminal insulators being snapped into the circuit board and their terminal lugs belonging to the terminals being electrically connected to the circuit board by soldering.

In addition, it is advantageous when terminals are integrated into the electric appliance and when, for adding additional terminals for expansion, a terminal block can be locked onto in each case one side wall of the two casing shells, the terminal block having terminals into which slide the terminal lugs of terminal insulators projecting out of the casing when locked together.

Another advantageous embodiment of the present invention is achieved when the switchgear has on the front side at least one turning knob as an adjusting element having an adjusting security device, where a mechanically coded plate can be locked onto the turning knob, with the mechanical coding of the plate corresponding to a certain position of the turning knob.

DETAILED DESCRIPTION

Figure 1:
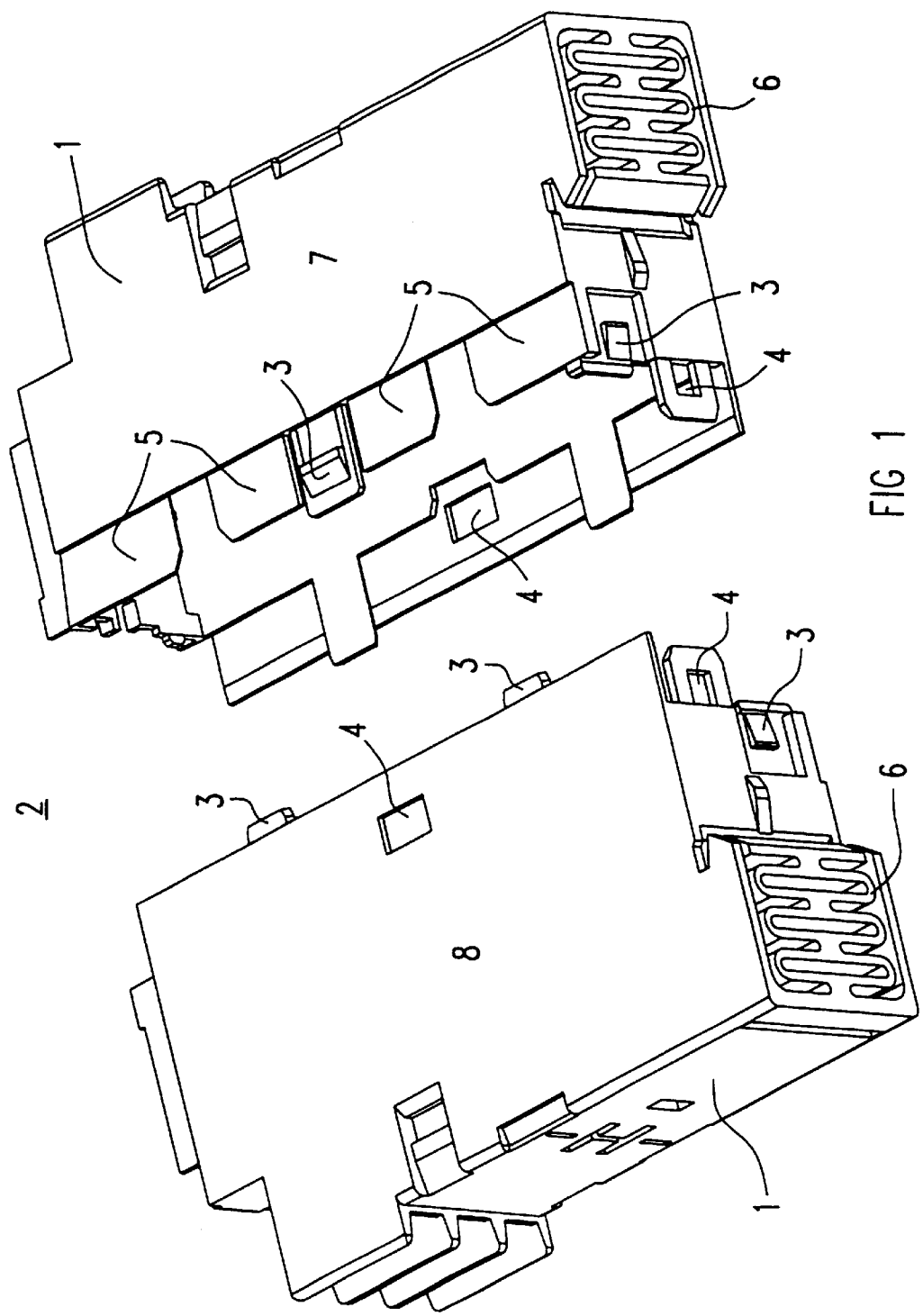
FIG. 1 is a perspective view showing a casing composed of two identically built casing shells.

FIG. 1 shows two identically built casing shells 1 arranged in mirror inversion to one another, assembled by catch elements 3, 4 on their edges to form a casing 2 of an electric appliance according to the present invention. Catch elements 3, 4 are composed of integrally molded locking hooks 3 and matching recesses 4. To stabilize assembled casing 2 and to simplify assembly, casing shells 1 have webs 5 on their edges, facilitating assembly because of their guidance function while also having a stabilizing effect because of the overlapping with side walls of in each case the other casing shell 1. A spring locking hook 6 is integrally molded on each of the side walls of casing shells 1 forming the rear wall of casing 2. These spring locking hooks are used for snap-on mounting of casing 2 on a mounting rail and permit dismantling without the use of a tool. Spring locking hook 6 which is integrated into casing shell 1 is dimensioned with respect to its force-strain characteristic so that the initial stress in the engaged state is sufficient to securely fix the appliance at defined maximum accelerations with a defined maximum appliance weight.

The separation joint of both casing shells 1 in the assembled state passes through the axes of symmetry of two opposing side walls 7 and 8 and on the outside along spring locking hooks 6.

Figure 2:
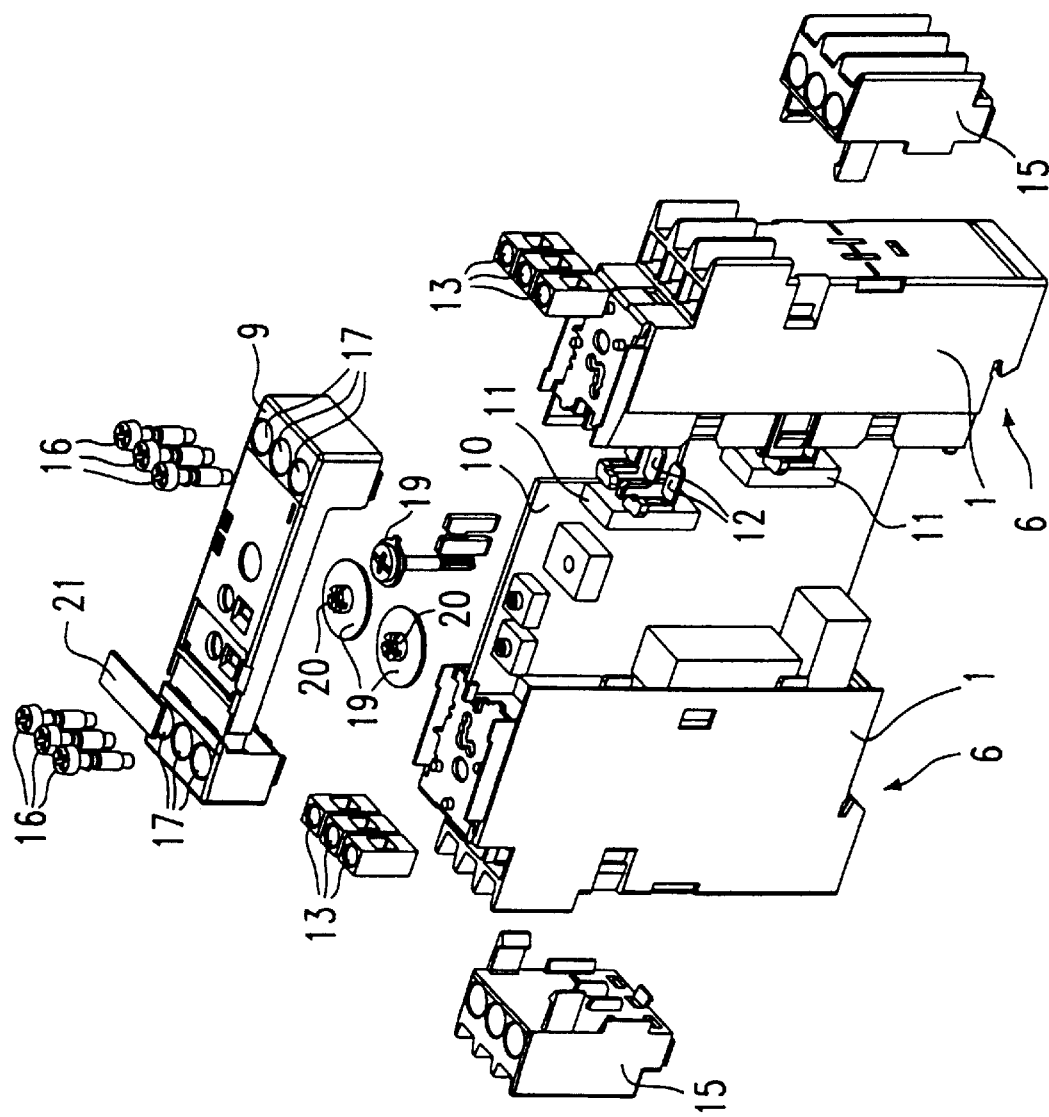
FIG. 2 is a perspective view of an electric appliance according to the present invention in a partially opened state.

FIG. 2 shows a perspective view of the electric appliance according to the present invention, with one casing shell 1 and a front cover 9 which extends over the two casing shells 1 in the assembled state having been removed. A circuit board 10 belonging to the electric appliance and having a plurality of terminal insulators 11 mounted on its edges has been inserted into casing shell 1 shown here. Terminal insulators 11 are each designed as 3-pin devices, i.e., they each have three terminal lugs 12 having extruded insulation. For assembly, terminal insulators 11 (see also FIGS. 3 and 4) are first snapped into circuit board 10 and then soldered. In assembly of circuit board 10 in casing shells 1, terminal lugs 12 of terminal insulators 11 contacted with circuit board 10 in this way slide into clamping cages 13, which are just indicated here and are in turn inserted into suitably designed pockets in casing shells 1. Terminal lugs 13 of terminal insulators 11 adjacent to spring locking hook 6 project out of casing 2 at the side and can be used for expanding by additional terminals, so that terminal blocks 15 are locked in this area of casing 2. In this way, the usual 6-pin appliances can be expanded to 12 pins.

Casing 2 can be covered by a cover 16 on the front side. After positioning cover 16, terminal screws (not shown) belonging to terminals on the casing are mounted from the outside through screw holes 17 and secured against loss by integrated catches 18 (not shown here) in the area of screw holes 17.

Figure 3:
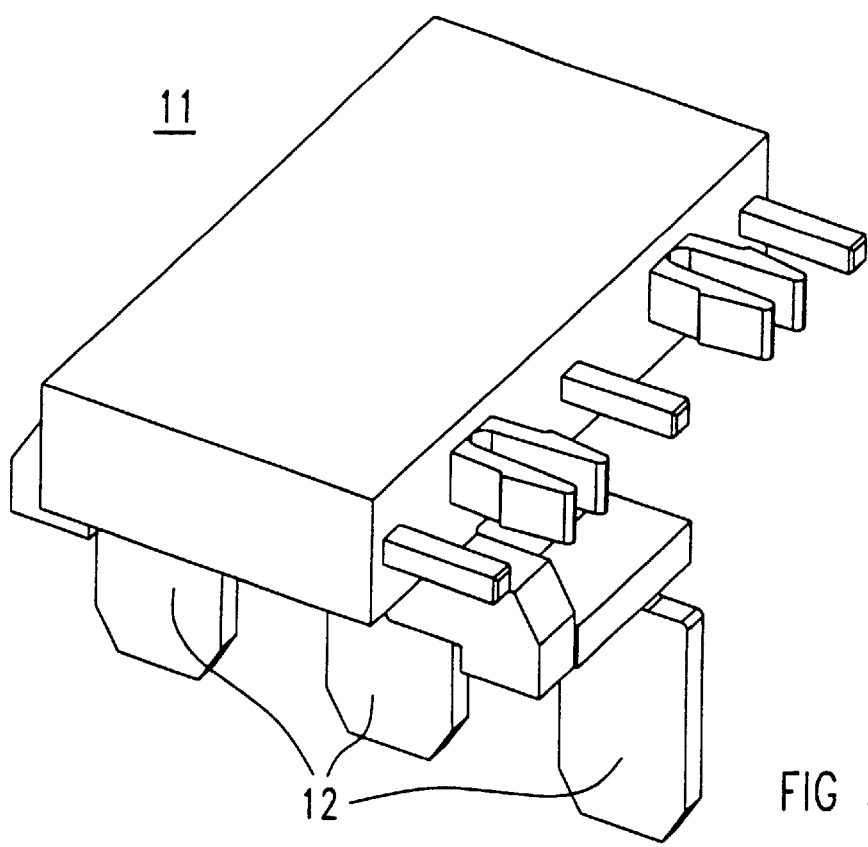
FIG. 3 is a perspective view of a terminal insulator.
Figure 4:
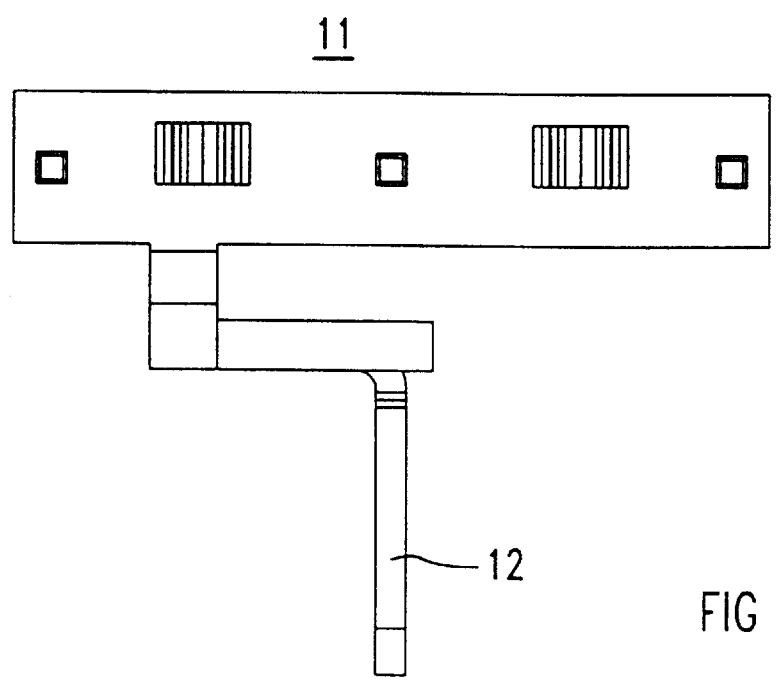
FIG. 4 is a side view of the terminal insulator according to FIG. 3.

Terminal insulators 15 are designed symmetrically according to FIGS. 3 and 4, permitting a 180° offset installation in various installation positions on circuit board 10. Thus, only a single embodiment of a terminal insulator 11 is sufficient to cover all applications.

Figure 5:
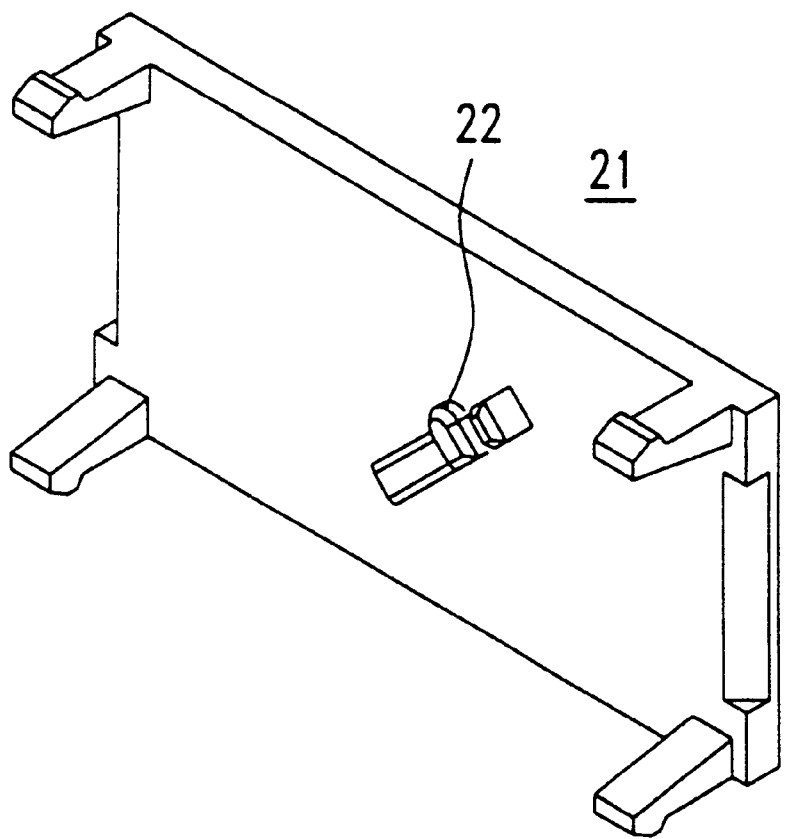
FIG. 5 is a perspective view of a plate used as the adjusting security device.

Adjusting elements operated by turning knobs 19 are provided on the front side of the electric appliance according to FIG. 2. Turning knobs 19 have mechanical codings 20 whose position changes accordingly with the angle of rotation of the respective turning knob 19. Through appropriately mechanically coded plates 21, which can lock onto the mechanical codings of turning knobs 19 according to FIG. 5, turning knobs 19 can be protected from unintentional adjustment. The adjustment value or function corresponding to the rotational position is applied in plain text or in graphic symbols to each plate 21. Due to the mechanical coding between turning knob 19 and plate 21, a certain plate 21 can be engaged only when turning knob 19 is in the matching position. Thus, it is possible to achieve a coding among several appliance variants through different positions of catches 22. This implements in a simple and inexpensive manner the pure function setting by turning knobs 19, with the additional function of securing the adjustment and providing a visible correlation between set value and function in plain text and graphic symbols.

Figure 6:
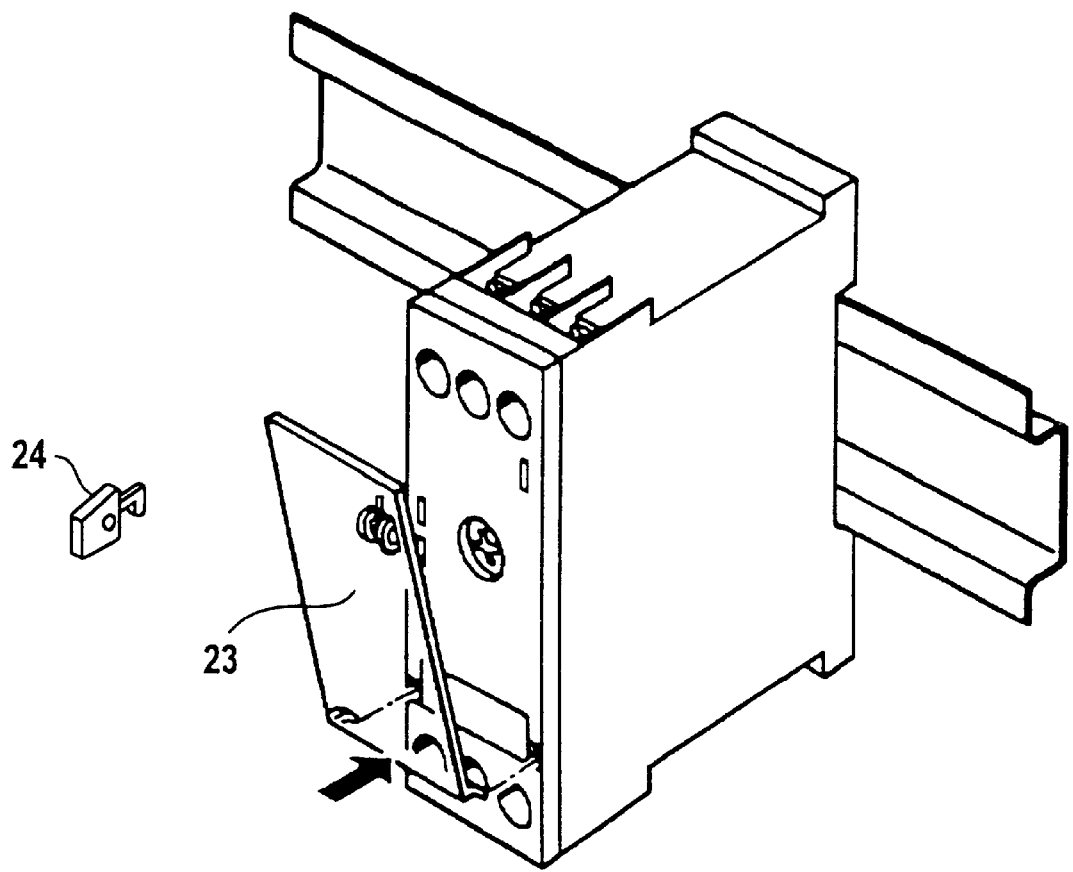
FIG. 6 is a perspective view of an electric appliance having a front cover that can be sealed.

The single adjustment of turning knobs 19 can also be performed through a cover, e.g., a transparent injection molded part 23 according to FIG. 6. Cover 23 can be sealed by a locking part 24 which is hooked in the casing.

Although the present invention is explained with reference to the embodiment illustrated in the accompanying drawing, it should be recalled that the intention is not to limit the present invention to only the embodiment illustrated here, but instead all possible revisions, modifications and equivalent arrangements are possible.

What is claimed is:

1. An electric appliance, comprising:
   a casing composed of two identically designed casing shells mounted in a mirror inversion to one another; and
   a snap-on mount provided on the casing for snap attachment to a mounting rail, the snap-on mount including two spring locking hooks, each of the two spring locking hooks being mounted on a different one of the two casing shells.

2. The electric appliance according to claim 1, further comprising:
   catch elements integrally molded on the casing shells and joining the casing shells together.

3. The electric appliance according to claim 1, further comprising:
   a circuit board mounted in an interior of the casing; and
   terminal insulators snapped into the circuit board, terminal lugs of the terminal insulators being electrically connected to the circuit board by solder.

4. The electric appliance according to claim 3, further comprising:
   first terminals integrated into the electric appliance; and
   a terminal block locked to a side wall of each of the two casing shells, the terminal block including second terminals into which slide the terminal lugs of the terminal insulators, the terminal lugs projecting out of the casing when the two casing shells are locked together.

5. The electric appliance according to claim 1, further comprising:
   a turning knob on a front side of the appliance, the turning knob being an adjusting element having an adjustment securing device; and
   a mechanically coded plate locked onto the turning knob, a mechanical coding of the plate corresponding to a predetermined position of the turning knob.

6. The electric appliance of claim 1, wherein the snap-on mount is provided for snap attachment of the casing to the rail after casing shells are mounted together in mirror inversion to one another.

7. A casing, comprising:
   a first casing shell; and
   a second casing shell, identical to the first casing shell, the first casing shell and second casing shell being connectable to each other in mirror inversion to one another, wherein each of the first and second casing shell includes a spring locking hook, and wherein the spring locking hooks form a mount for attaching the connected first and second casing shells to a rail.

8. The casing of claim 7, wherein the casing is for an electrical device.

9. The casing as claimed in claim 7, wherein the first and second casing shells include catch elements integrally molded thereto, for joining the casing shells together.

* * * * *